United States Patent
Maeda et al.

(10) Patent No.: US 11,656,541 B2
(45) Date of Patent: May 23, 2023

(54) LIGHT SOURCE APPARATUS AND IMAGE PROJECTION APPARATUS HAVING THE SAME

(71) Applicant: CANON KABUSHIKI KAISHA, Tokyo (JP)

(72) Inventors: Yuuki Maeda, Tochigi (JP); Takehito Kawasumi, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/171,306

(22) Filed: Feb. 9, 2021

(65) Prior Publication Data

US 2021/0255533 A1 Aug. 19, 2021

(30) Foreign Application Priority Data

Feb. 14, 2020 (JP) .............................. JP2020-023326

(51) Int. Cl.
*G03B 21/20* (2006.01)
*H01L 33/50* (2010.01)

(52) U.S. Cl.
CPC ....... *G03B 21/204* (2013.01); *G03B 21/2013* (2013.01); *G03B 21/2066* (2013.01); *H01L 33/505* (2013.01)

(58) Field of Classification Search
CPC .............. G03B 21/204; G03B 21/2013; G03B 21/2066
See application file for complete search history.

(56) References Cited

U.S. PATENT DOCUMENTS

| | | | |
|---|---|---|---|
| 2015/0219314 A1* | 8/2015 | Inoko | H04N 9/3158 362/84 |
| 2016/0327851 A1* | 11/2016 | Liao | G03B 21/2066 |
| 2017/0082912 A1* | 3/2017 | Wakabayashi | G03B 21/2013 |
| 2017/0153538 A1* | 6/2017 | Kawasumi | G02B 27/10 |
| 2017/0293212 A1* | 10/2017 | Wang | F21V 29/70 |
| 2018/0067385 A1* | 3/2018 | Nakada | G03B 21/208 |
| 2018/0149955 A1* | 5/2018 | Akiyama | G03B 21/204 |
| 2018/0348613 A1* | 12/2018 | Liao | G03B 21/204 |
| 2019/0227416 A1* | 7/2019 | Pan | G03B 21/2013 |
| 2019/0235368 A1* | 8/2019 | Liao | G03B 21/2066 |

FOREIGN PATENT DOCUMENTS

| | | |
|---|---|---|
| JP | 2015022954 A | 2/2015 |
| JP | 2017032762 A | 2/2017 |
| JP | 2018006133 A | 1/2018 |
| JP | 6507828 B2 | 5/2019 |
| JP | 2019160624 A | 9/2019 |

\* cited by examiner

*Primary Examiner* — Magda Cruz
(74) *Attorney, Agent, or Firm* — Rossi, Kimms & McDowell LLP

(57) ABSTRACT

A light source apparatus includes a light source configured to emit first light, a wavelength converter configured to emit second light having a wavelength different from that of the first light, a first optical system, and a second optical system configured to transmit the second light. The second optical system includes a reflector configured to reflect the first light to the wavelength converter. The first optical system condenses the first light from the light source on the wavelength converter, and guides the first light to the reflector.

12 Claims, 7 Drawing Sheets

US 11,656,541 B2

LIGHT SOURCE APPARATUS AND IMAGE PROJECTION APPARATUS HAVING THE SAME

BACKGROUND OF THE INVENTION

Field of the Invention

The present invention relates to a light source apparatus and an image projection apparatus having the same.

Description of the Related Art

Light source apparatuses have recently been developed which introduce a laser beam as excitation light into a phosphor (fluorescent body) and use fluorescent light generated from the phosphor for illumination light. Japanese Patent Laid-Open No. 2019-160624 and Japanese Patent No. 6507828 disclose light source apparatuses which introduce a laser beam to a phosphor mounted with a cooling member from a side opposite to the side mounted with the cooling member, and use the generated fluorescent light for illumination light.

The light source apparatus of Japanese Patent Laid-Open No. 2019-160624 introduces the laser beam from a gap between a condenser lens and the phosphor, and thus needs to widen the distance between them to some extent. In this case, a high-angle component cannot be taken in among the fluorescent light generated from the phosphor, and thus the condensing efficiency of the condenser lens is lowered. In addition, due to the laser beam incident at a high incident angle from the gap between the condenser lens and the phosphor, the condensing spot distorts and the light emission efficiency of the fluorescent light and the light utilization efficiency in the subsequent optical system are low.

The light source apparatus of Japanese Patent No. 6507828 improves the condensing efficiency by irradiating the laser beam from a through-hole formed in the condenser optical system while ensuring the condensing efficiency by reducing the gap between the condenser optical system and the phosphor. However, the light source apparatus of Japanese Patent No. 6507828 cannot increase a light amount finally extracted from the condenser optical system because the through-hole scatters the fluorescent light condensed by the condenser optical system.

SUMMARY OF THE INVENTION

The present invention provides a compact light source apparatus and an image projection apparatus having the same, each of which has a high condensing efficiency.

A light source apparatus according to one aspect of the present invention includes a light source configured to emit first light, a wavelength converter configured to emit second light having a wavelength different from that of the first light, a first optical system, and a second optical system configured to transmit the second light. The second optical system includes a reflector configured to reflect the first light to the wavelength converter. The first optical system condenses the first light from the light source on the wavelength converter, and guides the first light to the reflector. An image projection apparatus having the above light source apparatus also constitutes another aspect of the present invention.

Further features of the present invention will become apparent from the following description of exemplary embodiments with reference to the attached drawings.

DESCRIPTION OF THE EMBODIMENTS

Figure 1:
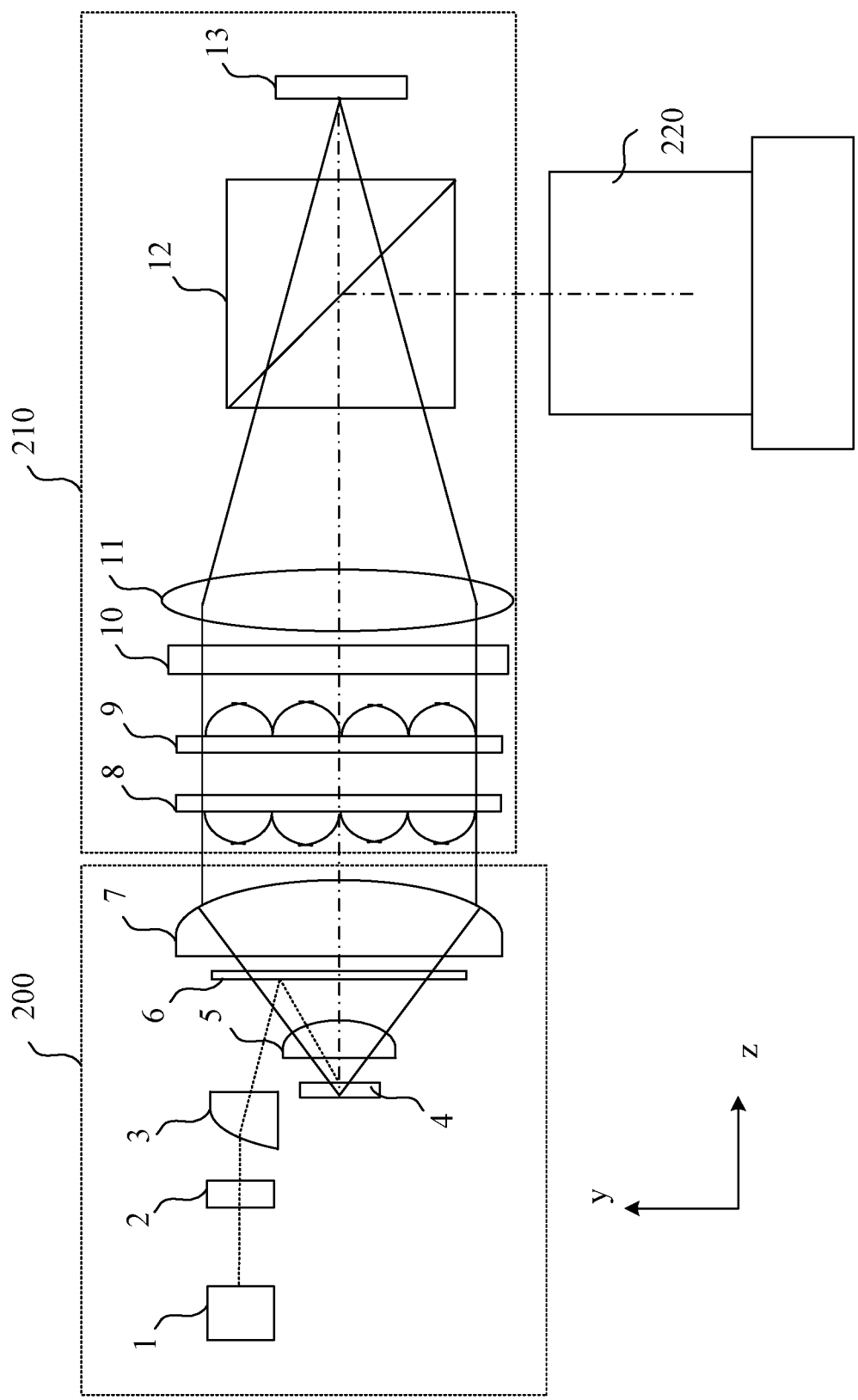
FIG. 1 is a configuration diagram of an image projection apparatus according to a first embodiment.

Referring now to the accompanying drawings, a detailed description will be given of embodiments according to the present invention. Corresponding elements in respective figures will be designated by the same reference numerals, and a duplicate description thereof will be omitted.

First Embodiment

FIG. 1 is a configuration diagram of an image projection apparatus according to a first embodiment. The image projection apparatus includes a light source apparatus 200, an illumination optical system 210, and a projection lens 220.

The light source apparatus 200 includes an LD unit 1, a micro fly-eye lens 2, a condenser lens 3, a phosphor unit (wavelength converter) 4, a first collimator lens 5, a wavelength separator (reflector) 6, and a second collimator lens 7. In this embodiment, a first optical system includes the condenser lens 3 and the first collimator lens 5. A second optical system includes the first collimator lens 5, the wavelength separator 6, and the second collimator lens 7.

The LD unit 1 has a plurality of LDs (laser diodes) and a plurality of collimator lenses, and emits blue light (first light). The blue light emitted from the LD unit 1 is condensed on the phosphor unit 4 via the micro fly-eye lens 2, the condenser lens 3, the wavelength separator 6, and the first collimator lens 5. A predetermined rectangular image is formed on the phosphor unit 4 by the optical actions of the micro fly-eye lens 2, the condenser lens 3, and the first collimator lens 5. The LD unit 1 may have an LED, a mercury lamp, or the like, instead of a laser beam source.

The phosphor unit 4 is an element in which a phosphor layer is coated on a substrate. A fluorescent light reflecting film is vapor-deposited between the substrate and the phosphor layer. That is, the phosphor unit 4 is a wavelength conversion element that converts at least part of the blue light emitted from the LD unit 1 into fluorescent light (second light) having a wavelength range different from that of the blue light. The substrate may use sheet metal having a high thermal conductivity such as aluminum and copper, or a transparent substrate having a high thermal conductivity such as a sapphire substrate. The phosphor unit 4 is not limited to a fixed method, and may have a configuration in which a rotating motor is disposed.

Figure 2:
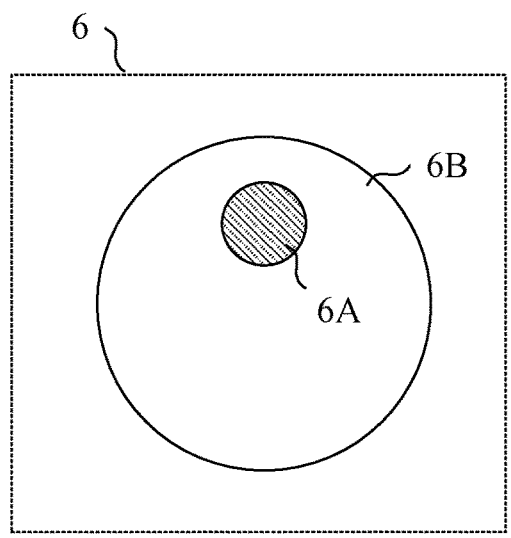
FIG. 2 is a configuration diagram of a wavelength separator according to the first embodiment.

The wavelength separator 6 is disposed between the phosphor unit 4 and a surface on an emission (or exit) side of the lens closest to the emission end (or side) in the optical system (the second collimator lens 7 in this embodiment). FIG. 2 is a block diagram of the wavelength separator 6. The wavelength separator 6 has a first area 6A and a second area 6B. The first area 6A is an area on which a dichroic film having a characteristic of reflecting blue light and transmitting fluorescent light is vapor-deposited. The second area 6B is an area on which an antireflection film having a characteristic of transmitting visible light including at least blue light and fluorescent light is vapor-deposited. If the first area 6A is sufficiently small, a mirror film may be vapor-deposited instead of the dichroic film. The blue light emitted from the LD unit 1 illuminates the first area 6A.

The wavelength separator 6 may be integrated with the second collimator lens 7. For example, a film having the same function as that of the wavelength separator 6 may be vapor-deposited on any surface of the second collimator lens 7.

The fluorescent light emitted from the phosphor unit 4 is collimated by the first collimator lens 5 and the second collimator lens 7 and enters the illumination optical system 210. The fluorescent light incident on the illumination optical system 210 illuminates a liquid crystal panel 13, which is an image display element, via an integrator system including the first fly-eye lens 8 and the second fly-eye lens 9, and the condenser lens 11. The fluorescent light that has transmitted through the integrator system is polarized into P-polarized light by a P/S conversion element 10, transmits through a PBS (polarization beam splitter) 12, and illuminates the liquid crystal panel 13. The light polarized from P-polarized light to S-polarized light by the liquid crystal panel 13 is reflected by the PBS 12 and projected onto an unillustrated screen through the projection lens 220.

Although the configuration for extracting the fluorescent light from the phosphor unit 4 has been described, white light including blue light and fluorescent light can be extracted by diffusing and reflecting part of the blue light emitted from the LD unit 1 by the phosphor unit 4. The blue light diffused and reflected by the phosphor unit 4 passes through the second area 6B of the wavelength separator 6 and enters the illumination optical system 210.

The LD unit 1 may be a light source that emits ultraviolet light, and the phosphor unit 4 may be a phosphor that emits white light with ultraviolet light. In that case, a dichroic film that reflects ultraviolet light and transmits white light is deposited on the first area 6A.

This embodiment uses a condenser that condenses blue light emitted from the LD unit 1 on the phosphor unit 4 by the condenser lens 3 and the first collimator lens 5, but the condenser lens 3 and the first collimator lens 5 may be an integrally molded lens. That is, the condenser may include only a single optical element.

The micro fly-eye lens 2 and the condenser lens 3 may be CGH (Computer Generated Hologram).

The image projection apparatus according to this embodiment uses a reflection type liquid crystal panel, but may use a transmission type liquid crystal panel or a micro mirror device.

The image projection apparatus according to this embodiment extracts white light from the light source apparatus 200, but in extracting only fluorescent light, the same dichroic film as the first area 6A may be vapor-deposited on the second area 6B of the wavelength separator 6.

A description will now be given of another configuration of the image projection apparatus.

When the phosphor unit 4 diffuses and reflects blue light to extract blue light, the following conditional expression (1) may be satisfied where A is an area of the first area 6A and B is an area of the second area 6B.

$$A/(A+B)<0.5 \tag{1}$$

When the value is higher than the upper limit in the conditional expression (1), the blue light diffused and reflected by the phosphor unit 4 is reflected by the wavelength separator 6, a large amount of the blue light gets lost, and the blue light required to produce the white light cannot be secured.

The numerical range of the conditional expression (1) may be set as follows.

$$A/(A+B)<0.3 \tag{1a}$$

An optical axis O1 of the condenser lens 3 may substantially coincide with an optical axis O2 of the first collimator lens 5 and the second collimator lens 7. When the optical axis O1 tilts to the optical axis O2, the optical axis O1 tilts to the normal line of the phosphor unit 4 and a rectangular image formed on the phosphor unit 4 is curved and the illumination efficiency lowers. An image larger than the predetermined rectangular image is shielded by the illumination optical system and the illumination efficiency lowers. When an image is smaller than the predetermined rectangular image, the light density in the phosphor unit 4 increases and the conversion efficiency decreases.

In order to take in the fluorescent light from the phosphor with high efficiency with a small optical system, an NA (numerical aperture) of the lens system including the first collimator lens 5 and the second collimator lens 7 needs to be larger. An air equivalent length of the first collimator lens 5 and the phosphor unit 4 may be 3.0 mm or less or 2.0 mm or less. The NA of the lens system may be 0.8 or more, or 0.9 or more.

Second Embodiment

Figure 3:
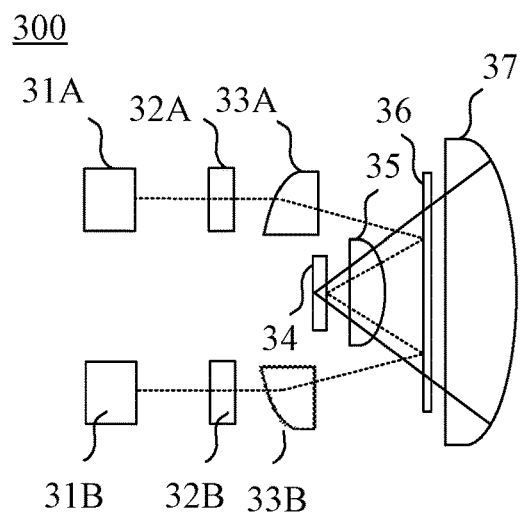
FIG. 3 is a configuration diagram of a light source apparatus according to a second embodiment.

FIG. 3 is a configuration diagram of a light source apparatus 300 included in an image projection apparatus according to this embodiment. The image projection apparatus according to this embodiment includes an illumination optical system 210 described in the first embodiment, an illumination optical system having the same configuration as that of the projection lens 220, and a projection lens. In the light source apparatus 300, two LD units, two micro fly-eye lenses, and two condenser lenses are disposed along the y direction. In this embodiment, the first optical system includes condenser lenses 33A and 33B and a first collimator lens 35. The second optical system includes the first collimator lens 35, the wavelength separator 36, and the second collimator lens 37.

ALD unit 31A (31B) has a plurality of LDs (laser diodes) and a plurality of collimator lenses, and emits blue light. The blue light emitted from the LD unit 31A (31B) is condensed on a phosphor unit 34 via a micro fly-eye lens 32A (32B), the condenser lens 33A (33B), a wavelength separator 36, and the first collimator lens 35. The wavelength separator 36 is an element on which a dichroic film having a characteristic of reflecting blue light and transmitting fluorescent light is vapor-deposited. A predetermined rectangular image is formed on the phosphor unit 34 by the optical actions of the micro fly-eye lens 32A (32B), the condenser lens 33A (33B), and the first collimator lens 35. Respective rectangular images of the blue light emitted from the LD units 31A and 31B are formed in the phosphor unit 34 so that they substantially coincide with or are aligned with each other. The fluorescent light emitted from the phosphor unit 34 is collimated by the first collimator lens 35 and the second collimator lens 37, and enters an unillustrated illumination optical system.

This embodiment has described the configuration in which two LD units are disposed for one set of collimator lenses, but two or more LD units may be disposed, or the blue light emitted from a single LD unit may be divided and used. As in the first embodiment, the wavelength separator 36 may be provided with the first and second areas to extract white light from the light source apparatus.

Third Embodiment

Figure 4:
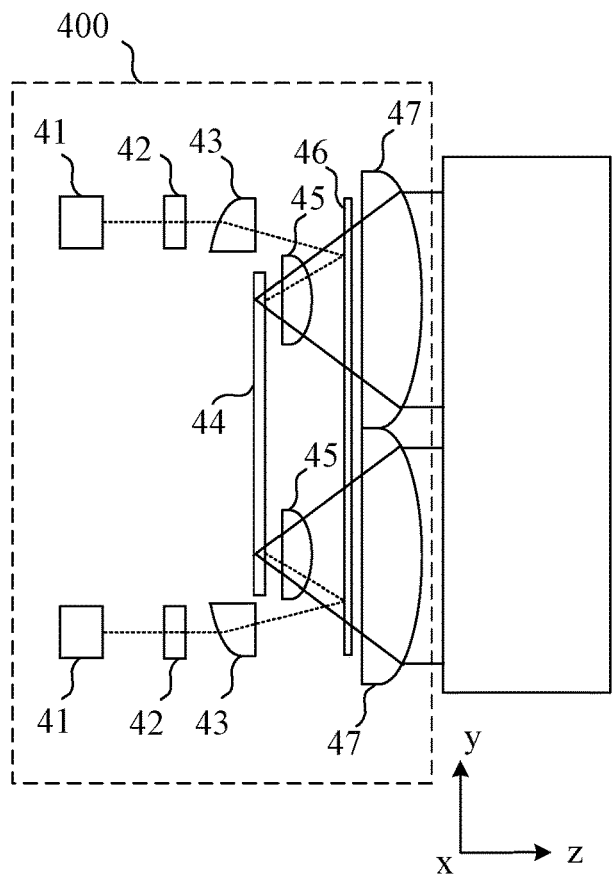
FIG. 4 is a configuration diagram of a light source apparatus according to a third embodiment.

FIG. 4 is a configuration diagram of a light source apparatus 400 included in an image projection apparatus according to this embodiment. The image projection apparatus according to this embodiment includes the illumination optical system 210 described in the first embodiment, an illumination optical system having the same configuration as that of the projection lens 220, and a projection lens. In this embodiment, LD units 41, micro fly-eye lenses 42, condenser lenses 43, first collimator lenses 45, and second collimator lenses 47 are arranged two each along each of the x direction and along the y direction (thus totally four each). In this embodiment, the first optical system includes the condenser lenses 43 and the first collimator lenses 45. The second optical system includes the first collimator lenses 45, a wavelength separator 46, and the second collimator lenses 47.

The blue light emitted from the LD units 41 is focused on the phosphor unit 44 via the micro fly-eye lenses 42, the condenser lenses 43, the wavelength separator 46, and the first collimator lenses 45. In the phosphor unit 44, four predetermined rectangular images are formed by the optical actions of the micro fly-eye lenses 42, the condenser lenses 43, and the first collimator lenses 45.

Figure 5:
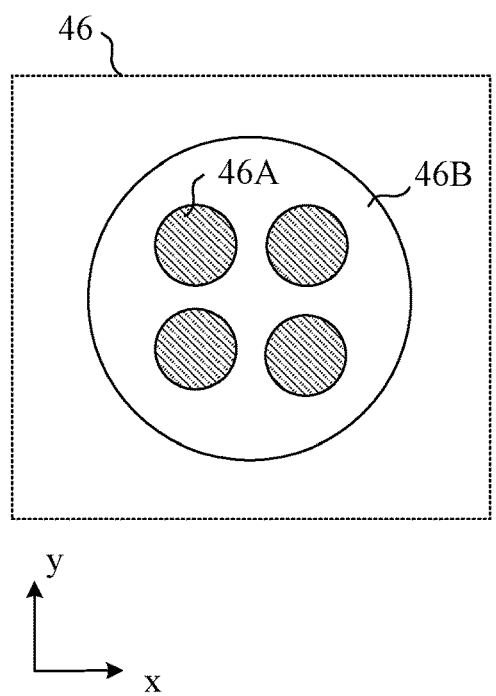
FIG. 5 is a configuration diagram of a wavelength separator according to the third embodiment.

FIG. 5 is a block diagram of the wavelength separator 46. The wavelength separator 46 has four first areas 46A and at least one second area 46B. The first area 46A is an area on which a dichroic film having a characteristic of reflecting the blue light and transmitting the fluorescent light is vapor-deposited. The second area 46B is an area on which an antireflection film having a characteristic of transmitting visible light including at least the blue light and the fluorescent light is vapor-deposited. If the first area 46A is sufficiently small, a mirror film may be vapor-deposited instead of the dichroic film. The blue light emitted from the LD unit 41 illuminates the first area 46A.

The fluorescent light emitted from the phosphor unit 44 is collimated by four sets of the first collimator lenses 45 and the second collimator lenses 47, and enters the unillustrated illumination optical system. The condenser lens 43, the first collimator lens 45, and the second collimator lens 47 may be integrated into a single optical element. The number of LD units and the number of collimator lenses may not be equal to each other, and the light emitted from the two LD units may enter one set of collimator lenses similar to the second embodiment.

Fourth Embodiment

Figure 6:
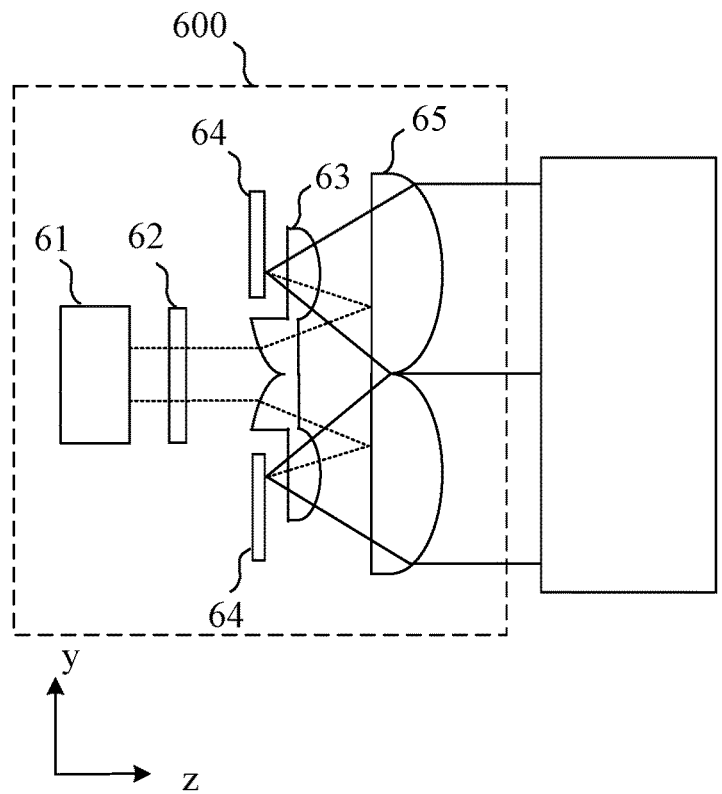
FIG. 6 is a configuration diagram of a light source apparatus according to a fourth embodiment.

FIG. 6 is a configuration diagram of a light source apparatus 600 included in an image projection apparatus according to this embodiment. The image projection apparatus according to this embodiment includes the illumination optical system 210 described in the first embodiment, an illumination optical system having the same configuration as that of the projection lens 220, and a projection lens. In this embodiment, the first optical system includes a first lens unit 63. The second optical system includes a first lens unit 63 and a second lens unit 65.

The light source apparatus according to this embodiment has a structure that is less expensive and smaller than that of the light source apparatus according to the third embodiment. The blue light emitted from an LD unit 61 enters the second lens unit 65 via a micro fly-eye lens 62 and the first lens unit 63. The second lens unit 65 is an element integrated with the wavelength separator 36 described in the second embodiment, and has a first area and a second area on the surface on the side of the phosphor unit 64. The blue light emitted from the LD unit 61 is reflected by the first area and condensed on the phosphor unit 64 via the first lens unit 63. A plurality of rectangular images are formed on the phosphor unit 64. The fluorescent light emitted from the phosphor unit 64 is collimated by the first lens unit 63 and the second lens unit 65, and enters the unillustrated illumination optical system.

Fifth Embodiment

Figure 7:
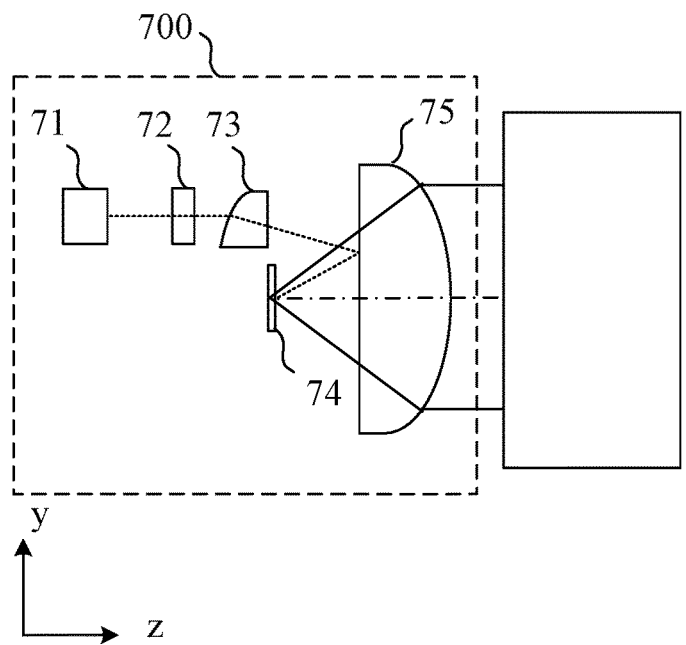
FIG. 7 is a configuration diagram of a light source apparatus according to a fifth embodiment.

FIG. 7 is a configuration diagram of a light source apparatus 700 included in an image projection apparatus according to this embodiment. The image projection apparatus according to this embodiment includes the illumination optical system 210 described in the first embodiment, an illumination optical system having the same configuration as that of the projection lens 220, and a projection lens. In this embodiment, the first optical system includes a condenser lens 73. The second optical system includes a collimator lens 75.

The blue light emitted from an LD unit 71 enters the collimator lens 75 via a micro fly-eye lens 72 and the condenser lens 73. The collimator lens 75 is an element integrated with the wavelength separator 6 described in the first embodiment, and has a first area and a second area on the surface on the side of the phosphor unit 74. The blue light emitted from the LD unit 71 is reflected by the first area and condensed on the phosphor unit 74. A predetermined rectangular image is formed on the phosphor unit 74 by the optical actions of the micro fly-eye lens 72 and the condenser lens 73. The fluorescent light emitted from the phosphor unit 74 is collimated by the collimator lens 75 and enters the unillustrated illumination optical system.

Sixth Embodiment

Figure 8:
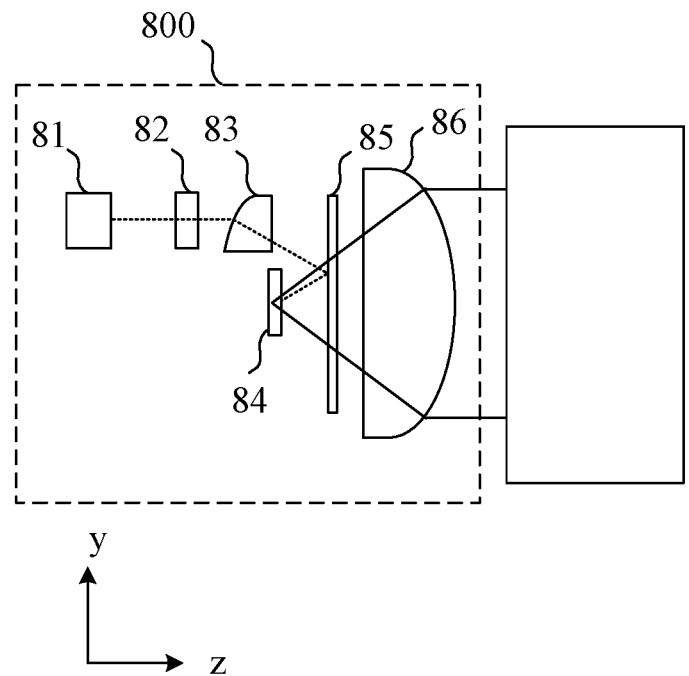
FIG. 8 is a configuration diagram of a light source apparatus according to a sixth embodiment.

FIG. 8 is a configuration diagram of a light source apparatus 800 included in an image projection apparatus according to this embodiment. The image projection apparatus according to this embodiment includes the illumination optical system 210 described in the first embodiment, an illumination optical system having the same configuration as that of the projection lens 220, and a projection lens. In this embodiment, the first optical system includes a condenser lens 83. The second optical system includes a wavelength separator 85 and a collimator lens 86.

The blue light emitted from the LD unit 81 is condensed on a phosphor unit 84 via a micro fly-eye lens 82, the condenser lens 83, and the wavelength separator 85. A predetermined rectangular image is formed on the phosphor unit 84 by the optical actions of the micro fly-eye lens 82 and the condenser lens 83. The wavelength separator 85 includes a first area and a second area, each of which has the same characteristic as that in the first embodiment. The fluorescent light emitted from the phosphor unit 84 is collimated by the collimator lens 86 and enters the unillustrated illumination optical system.

Seventh Embodiment

Figure 9:
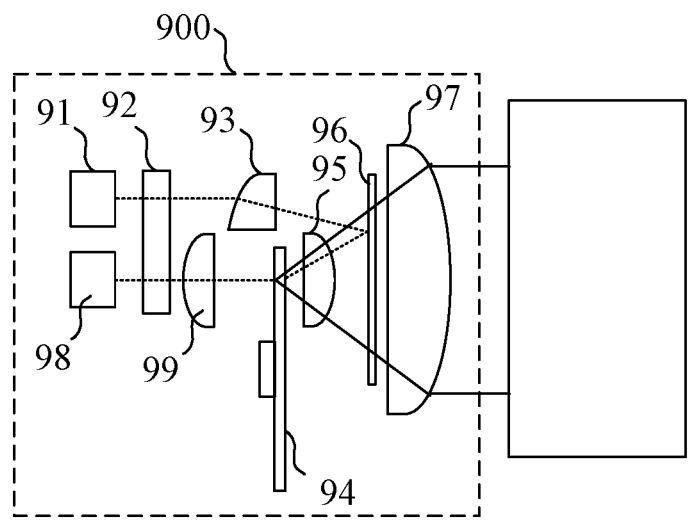
FIG. 9 is a configuration diagram of a light source apparatus according to a seventh embodiment.

FIG. 9 is a configuration diagram of a light source apparatus 900 included in an image projection apparatus according to this embodiment. The image projection apparatus according to this embodiment includes the illumination optical system 210 described in the first embodiment, an illumination optical system having the same configuration as that of the projection lens 220, and a projection lens. In this embodiment, the first optical system includes a condenser lens 93 and a first collimator lens 95. The second optical system includes a first collimator lens 95, a wavelength separator 96, and a second collimator lens 97.

The blue light emitted from a first LD unit 91 is condensed on the phosphor unit 94 from the side of the illumination optical system via the micro fly-eye lens 92, the first condenser lens 93, the wavelength separator 96, and the first collimator lens 95. A predetermined rectangular image is formed on the phosphor unit 94 by the optical actions of the micro fly-eye lens 92, the first condenser lens 93, and the first collimator lens 95.

The blue light emitted from a second LD unit 98 is condensed on the phosphor unit 94 from the side of the second LD unit 98 via the micro fly-eye lens 92 and the second condenser lens 99. A predetermined rectangular image is formed on the phosphor unit 94 by the optical actions of the micro fly-eye lens 92 and the second condenser lens 99.

The phosphor unit 94 is an element in which a phosphor layer is coated on a transparent substrate such as quartz or sapphire having a high thermal conductivity and a high transmittance. Since the phosphor layer is excited from both sides, the light density on the surface of the phosphor unit 94 can be reduced, and the light emission efficiency of the phosphor can be improved.

Eighth Embodiment

Figure 10:
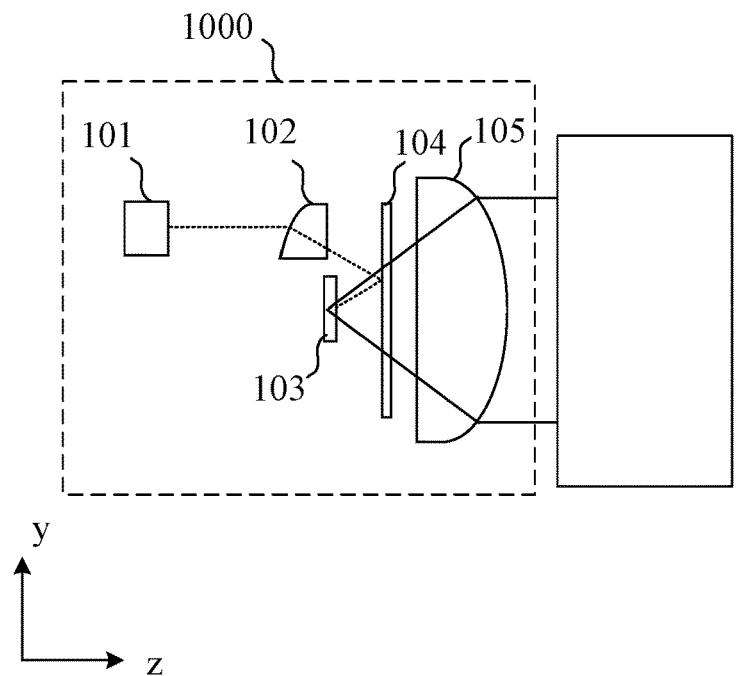
FIG. 10 is a configuration diagram of a light source apparatus according to an eighth embodiment.

FIG. 10 is a configuration diagram of a light source apparatus 1000 included in an image projection apparatus according to this embodiment. The image projection apparatus according to this embodiment includes the illumination optical system 210 described in the first embodiment, an illumination optical system having the same configuration as that of the projection lens 220, and a projection lens. In this embodiment, the first optical system includes a condenser lens 102. The second optical system includes an optical separator 104 and a collimator lens 105.

The light emitted from an LD unit 101 is condensed by a diffusion plate unit 103 via the condenser lens 102 and the light separator 104, and diffused by the diffusion plate unit 103. The diffusion plate unit 103 includes a diffusion plate that diffuses the light (first light) emitted from the LD unit 101 and emits light (second light) having a characteristic different from that of the light emitted from the LD unit 101.

Figure 11:
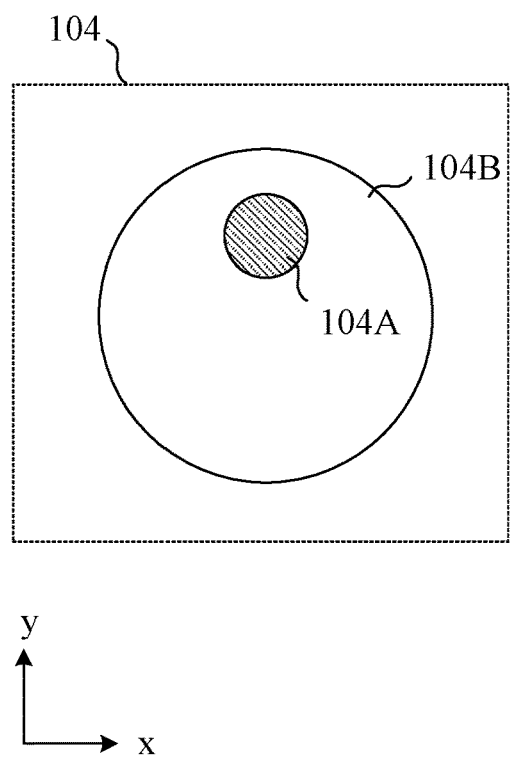
FIG. 11 is a block diagram of a light separator according to the eighth embodiment.

FIG. 11 is a configuration diagram of the light separator 104. The optical separator 104 has a first area 104A and a second area 104B. The first area 104A is an area on which a reflective film having a characteristic of reflecting the light emitted from the LD unit 101 is vapor-deposited. The second area 104B is an area on which an antireflection film having a characteristic of transmitting the light emitted from the LD unit 101 is vapor-deposited.

The light diffused by the diffusion plate unit 103 is collimated by the collimator lens 105 and enters the unillustrated illumination optical system.

The LD unit 101 is not limited to a single-color laser beam source, and may be a laser beam source unit that emits a combined two-color or three-color laser beam.

Ninth Embodiment

Figure 12:
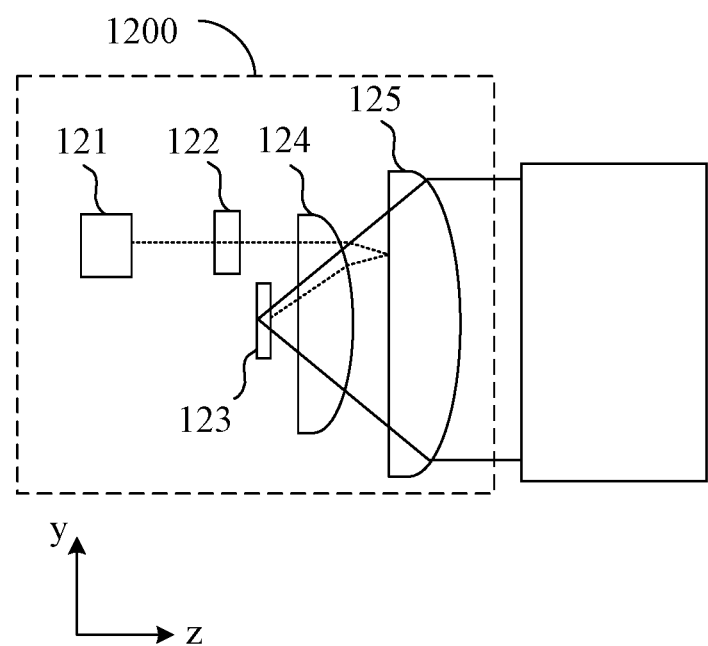
FIG. 12 is a configuration diagram of a light source apparatus according to a ninth embodiment.

FIG. 12 is a configuration diagram of a light source apparatus 1200 included in an image projection apparatus according to this embodiment. The image projection apparatus according to this embodiment includes the illumination optical system 210 described in the first embodiment, an illumination optical system having the same configuration as that of the projection lens 220, and a projection lens. In this embodiment, the first optical system includes a first lens 124. The second optical system includes a first lens 124 and a second lens 125.

The blue light emitted from an LD unit 121 enters the second lens 125 via the micro fly-eye lens 122 and the first lens 124. The second lens 125 is an element integrated with the wavelength separator 36 described in the second embodiment, and has a first area and a second area on the surface on the side of the phosphor unit 123. The blue light emitted from the LD unit 121 is reflected by the first area and condensed on the phosphor unit 123 via the first lens 124. A plurality of rectangular images are formed on the phosphor unit 123. The fluorescent light emitted from the phosphor unit 123 is collimated by the first lens 124 and the second lens 125, and enters the unillustrated illumination optical system.

Each of the above embodiment can provide a compact light source apparatus and an image projection apparatus having the same, each of which has a high condensing efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-023326, filed on Feb. 14, 2020 which is hereby incorporated by reference herein in its entirety.

What is claimed is:
1. A light source apparatus comprising:
a light source configured to emit first light;
a wavelength converter configured to emit second light having a wavelength different from that of the first light;
a first optical system; and
a second optical system configured to transmit the second light,
wherein the second optical system includes a reflector configured to reflect the first light toward a light source side with respect to the reflector to direct the first light to the wavelength converter,
wherein the first optical system guides the first light from the light source to the reflector, and
wherein the wavelength converter is disposed on the light source side with respect to the reflector.

2. The light source apparatus according to claim 1, wherein the reflector is disposed between the wavelength converter and a surface on an emission side of a lens that is closest to an emission end in the second optical system.

3. The light source apparatus according to claim 1, wherein the reflector transmits the second light.

4. The light source apparatus according to claim 1, wherein the first optical system includes a single optical element.

5. The light source apparatus according to claim 1, wherein the second optical system includes a single collimator lens.

6. The light source apparatus according to claim 1, wherein the second optical system includes a first collimator lens and a second collimator lens.

7. The light source apparatus according to claim 6, wherein the first optical system includes a single optical element and the first collimator lens.

8. The light source apparatus according to claim 1, wherein the reflector includes a first area having a characteristic of reflecting the first light, and a second area having a characteristic of transmitting the first light and the second light.

9. The light source apparatus according to claim 8, wherein the first area has a characteristic of transmitting the second light.

10. The light source apparatus according to claim 8, wherein the following conditional expression is satisfied:

$$A/(A+B) < 0.5$$

where A is an area of the first area and B is an area of the second area.

11. The light source apparatus according to claim 1, wherein the wavelength converter includes a diffusion plate configured to diffuse the first light and to emit the second light.

12. An image projection apparatus comprising:
a light source apparatus; and
an illumination optical system configured to guide light from the light source apparatus to an image display element,
wherein the light source apparatus includes:
 a light source configured to emit first light;
 a wavelength converter configured to emit second light having a wavelength different from that of the first light;
 a first optical system; and
 a second optical system configured to transmit the second light,
 wherein the second optical system includes a reflector configured to reflect the first light toward a light source side with respect to the reflector to direct the first light to the wavelength converter,
 wherein the first optical system guides the first light from the light source to the reflector, and
 wherein the wavelength converter is disposed on the light source side with respect to the reflector.

* * * * *